(12) United States Patent
Iwahori (10) Patent No.: US 10,510,508 B2
(45) Date of Patent: Dec. 17, 2019

(54) CHARGED PARTICLE BEAM APPARATUS

(71) Applicant: HITACHI HIGH-TECH SCIENCE CORPORATION, Minato-ku, Tokyo (JP)

(72) Inventor: Toshiyuki Iwahori, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/936,074

(22) Filed: Mar. 26, 2018

(65) Prior Publication Data

US 2018/0277332 A1 Sep. 27, 2018

(30) Foreign Application Priority Data

Mar. 27, 2017 (JP) .................. 2017-060904

(51) Int. Cl.

| H01J 37/04 | (2006.01) |
| H01J 37/244 | (2006.01) |
| H01J 37/20 | (2006.01) |
| H01J 37/22 | (2006.01) |
| H01J 37/09 | (2006.01) |

(52) U.S. Cl.
CPC ............ *H01J 37/045* (2013.01); *H01J 37/09* (2013.01); *H01J 37/20* (2013.01); *H01J 37/22* (2013.01); *H01J 37/244* (2013.01); *H01J 2237/002* (2013.01); *H01J 2237/20207* (2013.01)

(58) Field of Classification Search
CPC .......... H01J 37/045; H01J 37/20; H01J 37/26; H01J 2237/002
See application file for complete search history.

(56) References Cited

U.S. PATENT DOCUMENTS

| 2003/0184332 A1* | 10/2003 | Tomimatsu | ............ B82Y 35/00 324/750.22 |
| 2009/0224788 A1* | 9/2009 | Sasajima | ............ G01R 31/2891 324/754.21 |
| 2011/0006209 A1* | 1/2011 | Yoshikawa | ............ H01J 37/023 250/310 |
| 2012/0091363 A1* | 4/2012 | Doemer | ................... H01J 37/20 250/453.11 |
| 2013/0037706 A1* | 2/2013 | Ditto | ....................... H01J 37/20 250/282 |
| 2016/0071687 A1* | 3/2016 | Tsuchiya | ................... G01N 1/42 250/307 |

FOREIGN PATENT DOCUMENTS

JP      5314941      11/1993

* cited by examiner

*Primary Examiner* — Eliza W Osenbaugh-Stewart
(74) *Attorney, Agent, or Firm* — Adams & Wilks (57) ABSTRACT

A charged particle beam apparatus includes a sample chamber; a sample stage; an electron beam column for irradiating a sample with an electron beam; and a focused ion beam column for irradiating the sample with a focused ion beam. The apparatus includes a displacement member having an open/close portion displaceable between an insertion position between a beam emitting end portion of the electron beam column and the sample stage, and a withdrawal position away from the insertion position, and a contact portion provided at a contact position capable of contacting the sample before the beam emitting end portion during operation of the sample stage. A driving unit displaces the displacement member, and a conduction sensor detects whether the sample is in contact with the contact portion.

8 Claims, 7 Drawing Sheets

CHARGED PARTICLE BEAM APPARATUS

CROSS REFERENCE TO RELATED APPLICATION(S)

This application claims the benefit of Japanese Patent Application No. 2017-060904, filed Mar. 27, 2017, which is hereby incorporated by reference in its entirety into this application.

BACKGROUND OF THE INVENTION

1. Technical Field

The present invention relates generally to a charged particle beam apparatus.

2. Description of the Related Art

Conventionally, a composite charged particle beam apparatus that includes an electron beam column, a focused ion beam column, and a rotating shutter opening and closing an opening portion of an objective lens of the electron beam column is well known (referring to, e.g., Patent Document 1).

DOCUMENT OF RELATED ART (Patent Document 1) Japanese Patent Application Publication No. Hei. 5-314941

SUMMARY OF THE INVENTION

The composite charged particle beam apparatus according to the conventional technology may close an opening of an objective lens using a shutter when irradiating a sample with a focused ion beam, so as to prevent floating particles, such as sputter particles, gas, etc. from adhering to an objective lens or the inside of an electron beam column.

However, in the composite charged particle beam apparatus according to the conventional technology, different sample holders are used due to diversity of samples or uses, and thus it is necessary to control different operations of the sample stage for the sample holders. However, when an artificial mistake occurs in attaching the sample to the sample holder or selecting the sample holder, it is difficult to operate the sample stage appropriately, and the sample may be in contact with the electron beam column.

Accordingly, the present invention has been made keeping in mind the above problems occurring in the related art, and an object of the present invention is to provide a charged particle beam apparatus being capable of preventing that the sample is in contact with the electron beam column caused by an artificial mistake.

(1) According to an aspect of the present invention, a charged particle beam apparatus includes: a sample stage on which a sample is placed; a sample chamber receiving the sample stage therein; a charged particle beam column irradiating the sample with a charged particle beam; a displacement member including an open/close portion provided to be displaceable between an insertion position, which is between a beam emitting end portion of the charged particle beam column and the sample stage, and a withdrawal position, which is away from the insertion position, and a contact portion provided at a contact position capable of contacting the sample before the beam emitting end portion during operation of the sample stage; a driving means displacing the displacement member; and a detecting means detecting whether the sample is in contact with the contact portion.

(2) Also, according to an aspect of the present invention, in the charged particle beam apparatus described in (1), the driving means may include an actuator displacing the displacement member at least in a shift direction parallel to a tilt shaft of the sample stage.

(3) Also, according to an aspect of the present invention, in the charged particle beam apparatus described in (1), the driving means may include an actuator displacing the displacement member at least in a range that does not interfere with a tilt of the sample stage.

(4) Also, according to an aspect of the present invention, in the charged particle beam apparatus described in any one of (1) to (3), the apparatus may further include: an electrical insulation member electrically insulating the displacement member from the sample chamber and the driving means, and the displacement member wherein the detecting means may include a power source applying a voltage to the displacement member from outside of the sample chamber, and an electrical connection member electrically connecting the sample and the sample chamber detects whether the sample is in contact with the contact portion based on whether there is conduction between the sample and the contact portion.

(5) Also, according to an aspect of the present invention, in the charged particle beam apparatus described in any one of (1) to (4), the apparatus may further include: a thermal insulation member thermally insulating the displacement member from the sample chamber and the driving means and a cooling means cooling the displacement member to a temperature lower than that of the sample.

(6) Also, according to an aspect of the present invention, in the charged particle beam apparatus described in (5), the cooling means may include a cooling member placed in a vicinity of the sample, and a thermal connection member thermally connecting the cooling member and the displacement member.

(7) Also, according to an aspect of the present invention, in the charged particle beam apparatus described in any one of (1) to (6), the apparatus may further include: an imaging system obtaining intensity distribution of an actual image and a diffraction image by detecting transmitted charged particles or scattered charged particles of the sample, wherein the displacement member may include an aperture portion provided to be displaceable between the insertion position and the withdrawal position and an aperture penetrating hole passing the charged particle beam therethrough at the insertion position is formed on the aperture portion.

(8) Also, according to an aspect of the present invention, in the charged particle beam apparatus described in any one of (1) to (7), the charged particle beam column may include an electron beam column irradiating the sample with an electron beam, and a focused ion beam column irradiating the sample with a focused ion beam.

According to the charged particle beam apparatus of the present invention, the open/close portion is displaceable between the insertion position and the withdrawal position, and thus it is possible to prevent floating particles, such as sputter particles, gas, etc. from invading into the charged particle beam column and adhering thereto. During operation of the sample stage, the contact portion is provided at a contact position capable of contacting the sample before the beam emitting end portion of the charged particle beam column, and thus it is possible to prevent the sample from being in contact with the charged particle beam column even though an artificial mistake occurs.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a charged particle beam apparatus according to an embodiment of the present invention will be described with reference to the accompanying drawings.

Figure 1:
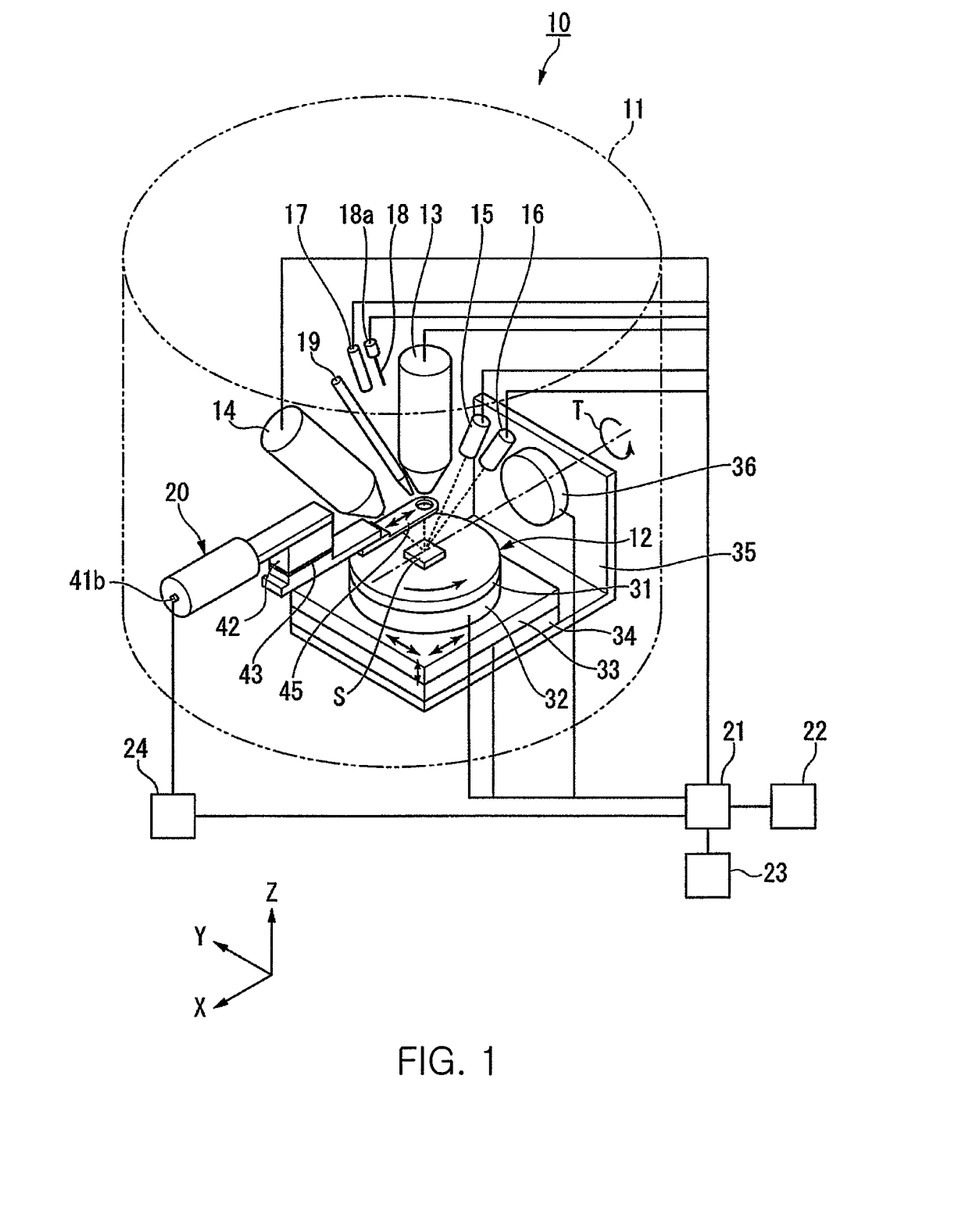
FIG. 1 is a perspective view illustrating schematic configurations of a charged particle beam apparatus according to an embodiment of the present invention.
Figure 2:
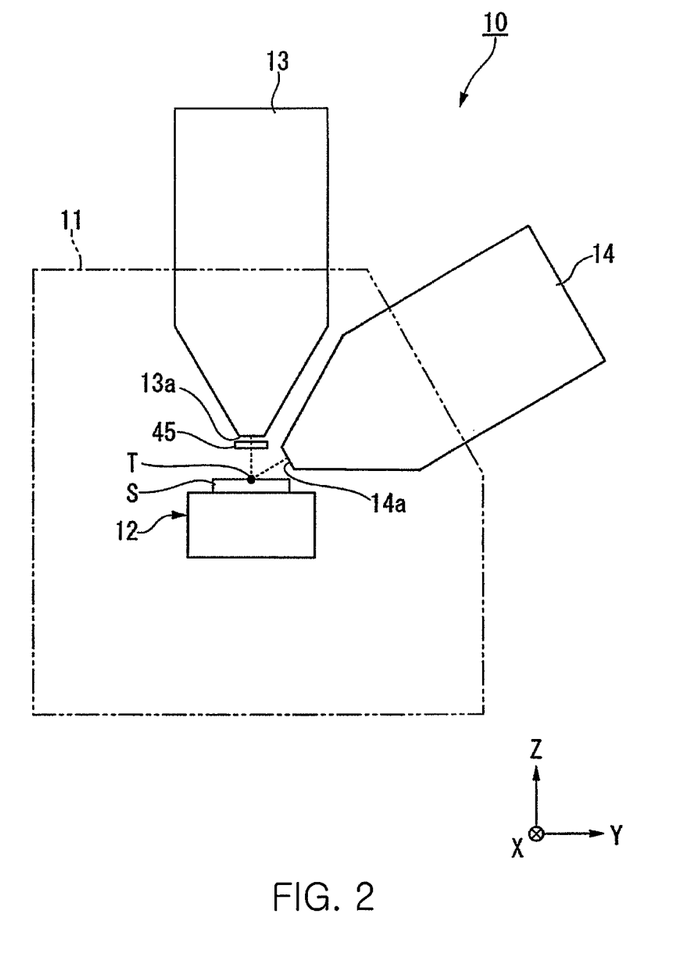
FIG. 2 is a side view illustrating schematic configurations of a part of a charged particle beam apparatus according to an embodiment of the present invention.
Figure 3:
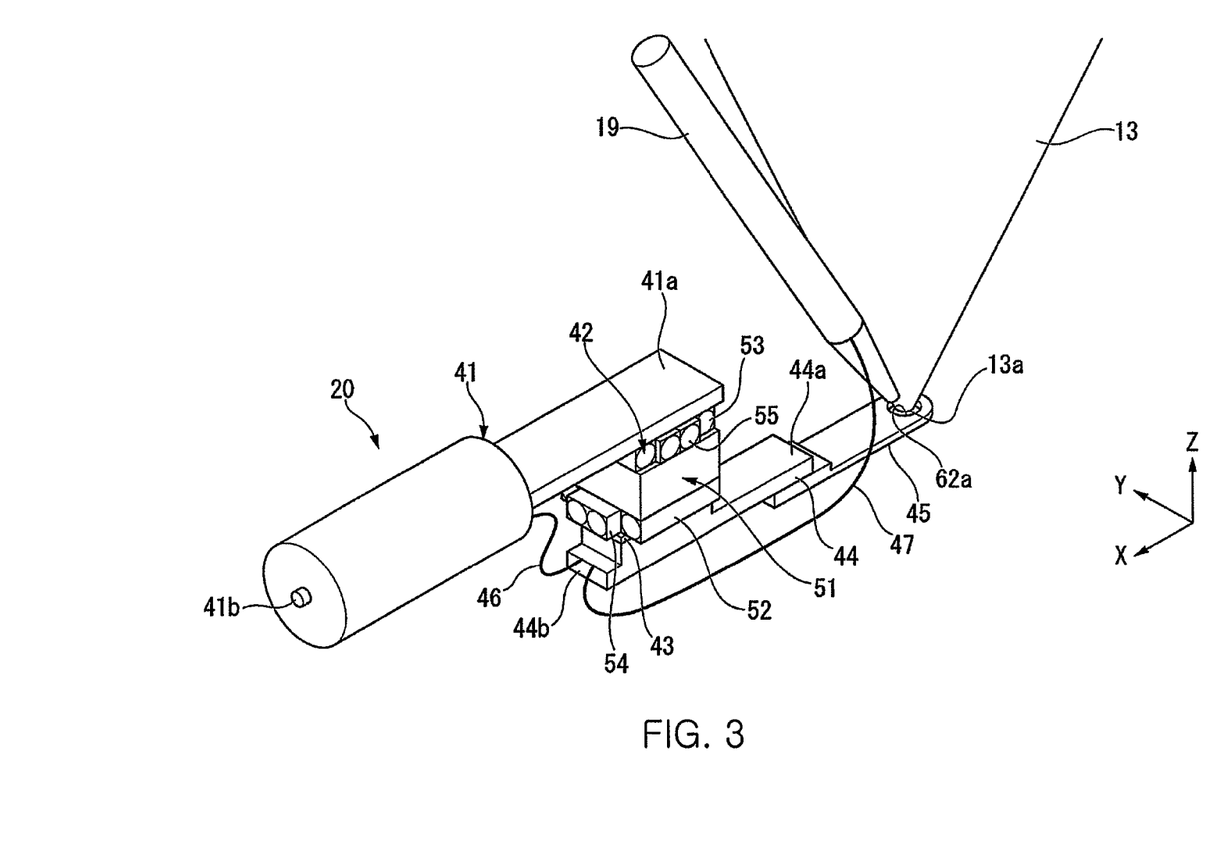
FIG. 3 is an enlarged perspective view illustrating a shutter unit of a charged particle beam apparatus according to an embodiment of the present invention.
Figure 4:
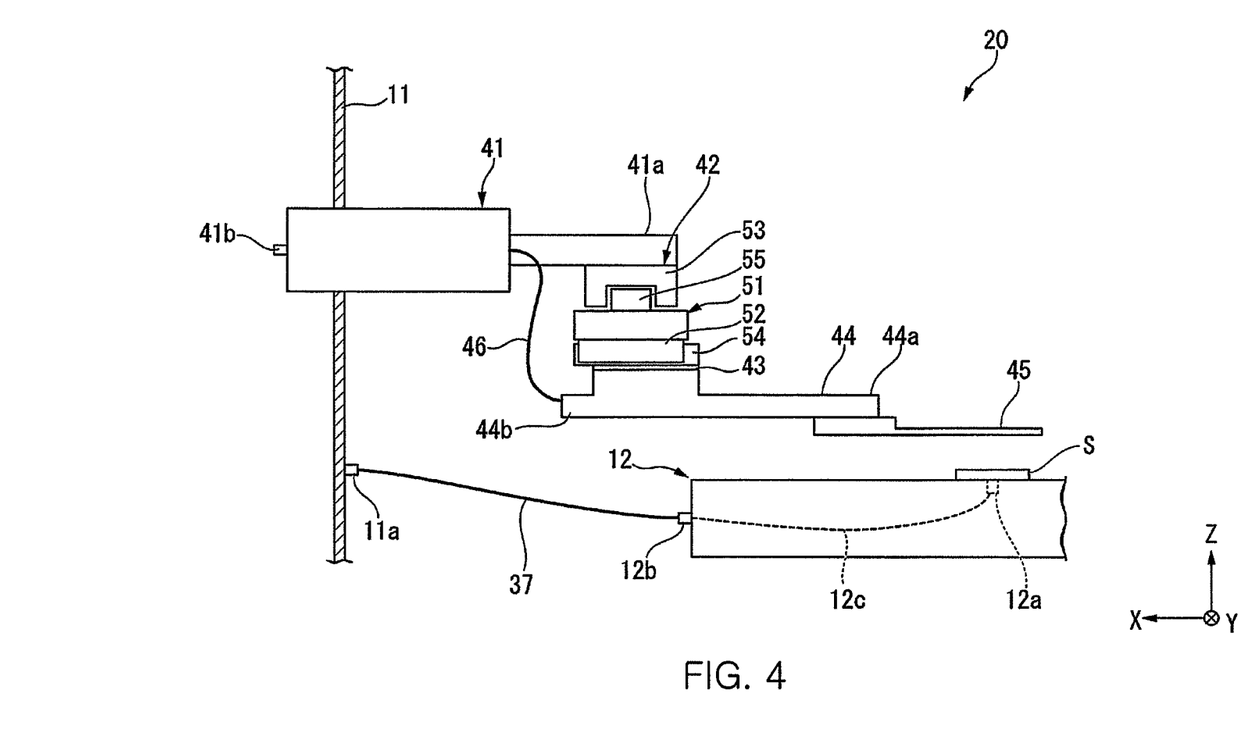
FIG. 4 is a side view illustrating schematic configurations of a shutter unit and a sample plate of a charged particle beam apparatus according to an embodiment of the present invention.

FIG. 1 is a perspective view illustrating schematic configurations of a charged particle beam apparatus 10 according to an embodiment of the present invention. FIG. 2 is a side view illustrating schematic configurations of a part of a charged particle beam apparatus 10 according to an embodiment of the present invention. FIG. 3 is an enlarged perspective view illustrating a shutter unit 20 of a charged particle beam apparatus 10 according to an embodiment of the present invention. FIG. 4 is a side view illustrating schematic configurations of a shutter unit 20 and a sample plate 12 of a charged particle beam apparatus 10 according to an embodiment of the present invention.

The charged particle beam apparatus 10 according to an embodiment of the present invention includes: a sample chamber 11 where internal pressure is maintained at a reduced state; a sample plate 12 fixing a sample S in the sample chamber 11; and an electron beam column 13 and a focused ion beam column 14 that are fixed in the sample chamber 11. The charged particle beam apparatus 10 includes: a detector fixed in the sample chamber 11, e.g., a secondary charged particle detector 15 and an EDS detector 16. The charged particle beam apparatus 10 includes: a gas supply unit 17 supplying gas on a surface of the sample S; a needle 18 transferring a micro sample piece (not shown) from the sample S fixed on the sample plate 12 to a sample piece holder (not shown); and a cooling member 19 placed in the vicinity of the sample S. The charged particle beam apparatus 10 includes a shutter unit 20 for the beam emitting end portion 13a of the electron beam column 13. The charged particle beam apparatus 10 includes, outside the sample chamber 11: a control device 21 controlling overall operation of the charged particle beam apparatus 10; an input device 22 connected to the control device 21; a display device 23; and a conduction sensor 24.

Also, hereinafter, an X-axis, a Y-axis, and a Z-axis define a three-dimensional rectangular coordinate system. The X-axis and the Y-axis are parallel to a reference place (e.g., a horizontal plane, etc.) perpendicular to an upward-downward direction of the charged particle beam apparatus 10, and the Z-axis is parallel to the upward-downward direction (e.g., a vertical direction perpendicular to a horizontal plane, etc.).

Also, an irradiation target of the electron beam column 13 and the focused ion beam column 14 is not limited to the sample S, and may be the sample piece, the sample piece holder, and the needle 18 existing in an irradiation region, etc.

The sample chamber 11 is an internal pressure housing having an airtight structure where internal pressure may be maintained at a desired reduced state. In the sample chamber 11, exhausting is performed by an exhaust device (not shown) until internal pressure reaches a desired reduced state.

The sample plate 12 includes: a sample stage 31 on which the sample S is placed; a first rotating unit 32 rotating the sample stage 31 around a rotating shaft parallel to the Z-axis; and a first supporting part 33 supporting the sample stage 31 and the first rotating unit 32. The sample plate 12 includes: a stage moving unit 34 moving the first supporting part 33 parallel to the X-axis, the Y-axis, and the Z-axis; and a second supporting part 35 supporting the first supporting part 33 and the stage moving unit 34. The sample plate 12 includes a second rotating unit 36 rotating the second supporting part 35 around a tilt shaft T parallel to the X-axis. The second rotating unit 36 is fixed in the sample chamber 11. The second rotating unit 36 enables the sample stage 31 to be tilted at an arbitrary angle with respect to the Y-axis. The first rotating unit 32, the stage moving unit 34, and the second rotating unit 36 are separately controlled by a control signal output from the control device 21 depending on an operation mode of the charged particle beam apparatus 10, etc.

The sample plate 12 includes a first end 12a electrically connected to the irradiation target fixed on the sample stage 31. The first end 12*a* is, for example, in contact with a surface of the irradiation target fixed on the sample stage 31 for an electrical connection. The sample plate 12 includes: a second end 12*b* provided at a position spaced apart from the irradiation target fixed on the sample stage 31; and a wire 12*c* electrically connecting the first end 12*a* and the second end 12*b*. The second end 12*b* of the sample plate 12 is, for example, electrically connected to an end 11*a* provided on the sample chamber 11 by an electrical connection member 37, such as a cable, etc.

The electron beam column 13 irradiates, with an electron beam EB, the irradiation target within a predetermined irradiation region inside the sample chamber 11. The electron beam column 13 enables, for example, a beam emitting end portion 13*a* for the electron beam to face the sample stage 31 in a Z-axis direction, enables an optical axis of the electron beam to be parallel to the Z-axis direction, and is fixed in the sample chamber 11. The electron beam column 13 includes: an electron source generating electrons; and electron optics focusing and deflecting electrons emitted from the electron source. The electron optics includes, for example, an electron lens, a deflector, etc. The electron source and the electron optics are controlled by the control signal output from the control device 21 depending on an irradiation position and an irradiation condition of the electron beam, etc.

The focused ion beam column 14 irradiates, with a focused ion beam FIB, the irradiation target within the predetermined irradiation region inside the sample chamber 11. The focused ion beam column 14 enables, for example, a beam emitting end portion 14*a* for the focused ion beam to face the sample stage 31 in a tilt direction tilted at a predetermined angle with respect to the Z-axis, enables an optical axis of the focused ion beam to be parallel to the tilt direction, and is fixed in the sample chamber 11. The focused ion beam column 14 includes: an ion source generating ions; and ion optics focusing and deflecting ions drawn out of the ion source. The ion optics includes, for example, a first electrostatic lens, such as a condenser lens, etc., an electrostatic deflector, and a second electrostatic lens, such as an objective lens, etc. The ion source and the ion optics are controlled by the control signal output from the control device 21 depending on the irradiation position and the irradiation condition of the focused ion beam, etc. The ion source is, for example, a liquid metal ion source using liquid gallium, etc, a plasma ion source, a gas field ion source, etc.

The charged particle beam apparatus 10 emits the focused ion beam to scan and irradiate the surface of the irradiation target, such that imaging of an irradiated part, various processing (excavating, trimming processing, etc.) by sputtering, forming of a deposition film, etc. can be performed. The charged particle beam apparatus 10 can perform processing of forming a sample piece (e.g., a thin sample slice, a needle-shaped sample, etc.) for transmission-observation from the sample S by a transmission electron microscope and a sample piece for analysis by the electron beam. The charged particle beam apparatus 10 can perform processing of the sample piece transferred to the sample piece holder into a thin film for desired thickness suitable for transmission-observation by the transmission electron microscope. The charged particle beam apparatus 10 emits the focused ion beam or the electron beam to scan and irradiate the surface of the irradiation target, such as the sample S, the sample piece, the needle 18, etc., whereby observation of the surface of the irradiation target can be performed.

Also, to change the positions of the electron beam column 13 and the focused ion beam column 14, the electron beam column 13 may be provided in the tilt direction and the focused ion beam column 14 may be provided in the Z-axis direction.

The secondary charged particle detector 15 detects a secondary charged particle (a secondary electron, and a secondary ion) generated from the irradiation target due to irradiation with the focused ion beam or the electron beam. The EDS detector 16 detects an X-ray generated from the irradiation target due to irradiation with the electron beam. The secondary charged particle detector 15 and the EDS detector 16 separately access the control device 21, and detection signals output from the secondary charged particle detector 15 and the EDS detector 16 are transmitted to the control device 21.

Without being limited to the secondary charged particle detector 15 and the EDS detector 16, the charged particle beam apparatus 10 may include another detector. As another detector, for example, there are a back-scattered electron detector, an EBSD detector, etc. The back-scattered electron detector detects back-scattered electrons back-scattered from the irradiation target due to irradiation with the electron beam. The EBSD detector detects an electron beam back-scattered diffraction pattern generated from the irradiation target due to irradiation with the electron beam. Also, in the secondary charged particle detector 15, the secondary electron detector detecting the secondary electron and the back-scattered electron detector may be provided in a housing of the electron beam column 13.

The gas supply unit 17 is fixed in the sample chamber 11. The gas supply unit 17 includes a gas spray part (nozzle) provided to face the sample stage 31. The gas supply unit 17 supplies etching gas, deposition gas, etc. to the irradiation target. The etching gas is used to stimulate etching of the irradiation target by the focused ion beam selectively depending on the material of the irradiation target. The deposition gas is used to form the deposition film on the surface of the irradiation target by a deposit, such as metal, an insulator, etc.

The needle 18 is, for example, displaceable within the sample chamber 11 by a needle driving unit 18*a* provided independently of the sample plate 12. The needle 18 extracts a micro sample piece from the sample S fixed on the sample plate 12, and holds and transfers the sample piece to the sample piece holder.

The gas supply unit 17 and the needle driving unit 18*a* are separately controlled by the control signal output from the control device 21 depending on the operation mode of the charged particle beam apparatus 10, etc.

The cooling member 19 is, for example, fixed in the sample chamber 11. The cooling member 19 is thermally connected to a cooling rod of a liquid nitrogen container provided outside the sample chamber 11 via a thermal conduction member. The cooling member 19 is placed in the vicinity of the irradiation target as being in a state cooled to a temperature lower than that of the irradiation target so as to adsorb floating particles, such as sputter particles, gas, etc., whereby contamination of the irradiation target may be prevented.

The shutter unit 20 includes a first supporting member 41, a driving unit 42, an insulation member 43, a second supporting member 44, and a displacement member 45.

The first supporting member 41 is fixed in the sample chamber 11. The first supporting member 41 is, for example, provided in the shape of a rod extending in the X-axis direction. A front end portion 41*a* in the X-axis direction of the first supporting member 41 supports the driving unit 42 inside the sample chamber 11. The first supporting member 41 holds a cable 46 therein, the cable being electrically connected to an end 41b provided outside the sample chamber 11.

The driving unit 42 includes an actuator driving in at least one arbitrary axis direction within a place intersecting an optical axis of the electron beam column 13, for example, a two-axis actuator 51 driving in the X-axis direction and the Y-axis direction. The actuator 51 is, for example, a piezoelectric actuator. The actuator 51 includes: a first guide rail 52 and a second guide rail 53 extending in the X-axis direction and the Y-axis direction respectively; and a first slider 54 and a second slider 55 moving along the first guide rail 52 and the second guide rail 53, respectively. The actuator 51 is controlled by the control signal output from the control device 21 depending on the operation mode of the charged particle beam apparatus 10, etc.

The insulation member 43 is provided between the driving unit 42 and a second supporting member 44. The insulation member 43 is, for example, provided in the shape of a plate. The insulation member 43 is, for example, formed by a material having high electrical insulation and thermal insulation, such as resin, ceramics, etc. The insulation member 43 electrically and thermally insulates the driving unit 42 and the sample chamber 11 from the second supporting member 44 and the displacement member 45.

The second supporting member 44 is fixed to the driving unit 42 by the insulation member 43. The second supporting member 44 is, for example, provided in the shape of a plate extending in the X-axis direction. The second supporting member 44 is, for example, formed by a conductive material, such as a resin material with a conductive surface coating, a non-magnetic metal material, etc. In the second supporting member 44 in the X-axis direction, a first end portion 44a close to the electron beam column 13 supports the displacement member 45. In the second supporting member 44 in the X-axis direction, a second end portion 44b distant from the electron beam column 13 is electrically connected to the cable 46. Thus, the second supporting member 44 is electrically connected to the end 41b provided outside the sample chamber 11. The second end portion 44b is thermally connected to the cooling member 19 via the thermal conduction member 47, such as a stranded wire, a ribbon, etc. that is formed of a material with high-thermal conductivity, such as aluminum, copper, etc. As a result, the second supporting member 44 is cooled by the cooling member 19 to a temperature lower than that of the irradiation target. Also, the second end portion 44b is thermally connected via a cooling tube where cooling gas circulates, etc. rather than the thermal conduction member 47. The cable 46, the thermal conduction member 47, the cooling tube, etc. are provided so as not to interfere with driving of the second supporting member 44 and the displacement member 45 by the driving unit 42.

The second supporting member 44 is provided at a position distant from a space between the beam emitting end portion 13a of the electron beam column 13 and the sample stage 31 so as not to interfere with the electron beam from the electron beam column 13 irradiating the irradiation target, even when the second supporting member is displaced by the driving unit 42 in the X-axis direction or the Y-axis direction.

Figure 5:
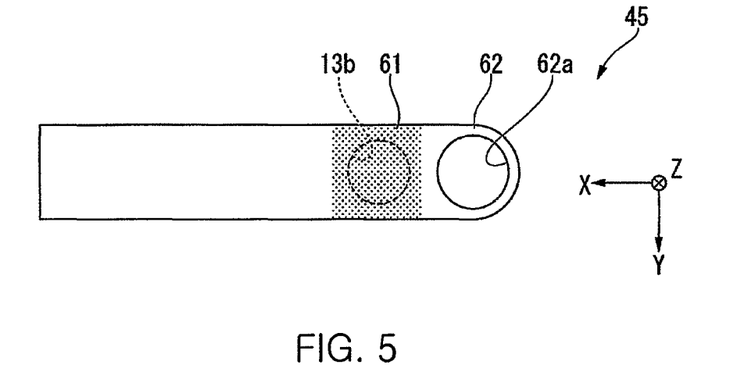
FIG. 5 is a plan view illustrating a displacement member of a charged particle beam apparatus according to an embodiment of the present invention viewed from a sample stage, and illustrating a state where an open/close portion placed at an insertion position blocks an opening of a beam emitting end portion.

FIG. 5 is a plan view illustrating a displacement member 45 of a shutter unit 20 of a charged particle beam apparatus 10 according to an embodiment of the present invention viewed from a sample stage 31, and illustrating a state where an open/close portion 61 placed at an insertion position blocks an opening 13b of a beam emitting end portion 13a The displacement member 45 is fixed to the second supporting member 44. The displacement member 45 is, for example, provided in the shape of a plate extending in the X-axis direction. The displacement member 45 is, for example, formed by a non-magnetic metal material, such as Titan, etc. or by a non-magnetic material having conductivity, such as a resin material having a conductive surface coating, etc.

The displacement member 45 includes the open/close portion 61 provided to be displaceable between an insertion position which is between the beam emitting end portion 13a of the electron beam column 13 and the sample stage 31, and a withdrawal position, which is away from the insertion position. The insertion position is, for example, a position where the open/close portion 61 blocks the opening of the beam emitting end portion 13a, such as a position right in front of the opening 13b formed on the beam emitting end portion 13a of the electron beam column 13 in the Z-axis direction, etc. The withdrawal position is, for example, a position where the open/close portion 61 unblocks the opening 13b of the beam emitting end portion 13a, such as a position moved from the position right in front of the opening 13b of the beam emitting end portion 13a in the Z-axis direction to the X-axis direction, etc. The open/close portion 61 is, for example, displaced between the insertion position and the withdrawal position depending on driving of the displacement member 45 in the X-axis direction by the driving unit 42.

The open/close portion 61 is, for example, placed at the insertion position due to driving of the displacement member 45 by the driving unit 42, when the irradiation target is irradiated by the focused ion beam from the focused ion beam column 14. Thus, the open/close portion 61 is placed to block the opening 13b of the beam emitting end portion 13a of the electron beam column 13. For example, occurrence of internal pollution, in which floating particles, such as sputter particles, gas, etc., generated from the irradiation target, invade into the electron beam column 13 and adhere to the objective lens, etc., is prevented.

The open/close portion 61 is, for example, placed at the withdrawal position due to driving of the displacement member 45 by the driving unit 42 after irradiation of the irradiation target by the focused ion beam, when the irradiation target is irradiated by the electron beam from the electron beam column 13. Thus, the open/close portion 61 is placed to open the opening 13b of the beam emitting end portion 13a. For example, the open/close portion is placed so as not to interfere with irradiation of the irradiation target by the electron beam from electron beam column 13 and observation of the secondary electron generated from the irradiation target by the secondary charged particle detector 15.

The displacement member 45 includes a contact portion 62 provided at a contact position capable of contacting the irradiation target before the beam emitting end portion 13a of the electron beam column 13 during operation of the sample stage 31. The contact position is, for example, a position, which is closer to the beam emitting end portion 13a, between the beam emitting end portion 13a and the sample stage 31 without interfering with the electron beam from the electron beam column 13 irradiating the irradiation target, such as the vicinity of the position right in front of the beam emitting end portion 13a of the electron beam column 13 in the Z-axis direction, etc. The contact portion 62 in the X-axis direction of the displacement member 45 is provided at a front end portion close to the electron beam column 13. The contact portion 62 is, for example, provided in the shape of a ring plate, and the contact portion 62 is provided with a penetrating hole 62a passing the electron beam from the electron beam column 13 therethrough to irradiate the irradiation target. The size of the penetrating hole 62a is, for example, larger than that of the beam emitting end portion 13a of the electron beam column 13 so as not to interfere with the electron beam from the electron beam column 13 irradiating the irradiation target. When the open/close portion 61 is placed at the withdrawal position, for example, a relative position of the contact portion 62 with respect to the open/close portion 61 is set to place the penetrating hole 62a at the insertion position.

The displacement member 45 is electrically connected to the end 41b outside the sample chamber 11 via the second supporting member 44 and the cable 46. Thus, change in electrical characteristics depending on whether the contact portion 62 is in contact with the irradiation target is detected by the conduction sensor 24 connected to the end 41b outside the sample chamber 11.

The control device 21 controls overall operation of the charged particle beam apparatus 10 by a signal output from the input device 22, a signal generated by preset automatic operation control processing, etc. The input device 22 includes a mouse, a keyboard, etc. that output a signal in consequence of input operation of an operator.

The control device 21 enables the display device 23 to display a screen for performing various settings such as mode selection, processing setting, etc. in automatic sequence control. The control device 21 enables the display device 23 to display image data generated based on a state quantity detected by various detectors, such as the secondary charged particle detector 15, the EDS detector 16, etc. in addition to an operation screen for the image data. The control device 21 enables, for example, the electron beam or the focused ion beam to scan the irradiation position, and converts a detected amount of secondary charged particles detected by the secondary charged particle detector 15 to a luminance signal corresponding to the irradiation position, thereby generating the image data representing the shape of the irradiation target by two-dimensional position distribution of the detected amount of secondary charged particles. The control device 21 enables the display device 23 to display the generated image data in addition to a screen for executing operations, such as zoom-in, zoom-out, shift, rotation, etc. of each image data.

The conduction sensor 24 detects electrical characteristics relating to conduction between the contact portion 62 of the displacement member 45 and the irradiation target fixed on the sample plate 12. The conduction sensor 24 includes, for example, an electricity-flowing circuit flowing electricity to the displacement member 45; and a resistance meter provided between the displacement member 45 and the sample chamber 11, etc. The conduction sensor detects an electrical resistance value as electrical characteristics relating to conduction of the displacement member 45 and the irradiation target, and outputs an electrical resistance value signal to the control device 21. When the electrical resistance value detected by the conduction sensor 24 is larger than a preset resistance value, the control device 21 determines that there is no conduction between the displacement member 45 and the irradiation target, and that the contact portion 62 of the displacement member 45 is not in contact with the irradiation target. When the electrical resistance value detected by the conduction sensor 24 is equal to or less than the preset resistance value, the control device 21 determines that the displacement member 45 is electrically connected to the irradiation target and the contact portion 62 of the displacement member 45 is in contact with the irradiation target. When determining that the displacement member 45 is in contact with the irradiation target during driving of the sample plate 12, the control device 21 stops driving of the sample plate 12 to prevent the irradiation target from being in contact with the beam emitting end portion 13a of the electron beam column 13.

Also, the conduction sensor 24 may, without being limited to the electrical resistance value, for example, detect a state quantity for detecting change in electrical characteristics between the displacement member 45 and the irradiation target, such as a current, a voltage, etc.

As described above, according to the charged particle beam apparatus 10 of the embodiment, the open/close portion 61 is displaceable between the insertion position and the withdrawal position by driving of the driving unit 42, whereby floating particles, such as sputter particles, gas, etc. are prevented from invading into the electron beam column 13 and adhering thereto. The contact portion 62 is provided at the contact position capable of contacting the irradiation target, such as the sample S, etc., before the beam emitting end portion 13a of the electron beam column 13 during operation of the sample stage 31, whereby the irradiation target, such as the sample S, etc. is prevented from being in contact with the electron beam column 13 even though an artificial mistake, etc. occurs.

The driving unit 42 includes the actuator 51 displacing the displacement member 45 in a shift direction parallel to the tilt shaft T of the sample stage 31 such that it is possible to inhibit driving of the displacement member 45 from interfering with rotation of the sample plate 12 around the tilt shaft T.

The contact portion 62 is provided in the shape of a ring plate, and thus, for example, in addition to approach of the irradiation target in a predetermined approach direction to the beam emitting end portion 13a of the electron beam column 13 in consequence of rotation of the sample plate 12 around the tilt shaft T, whether the irradiation target is in contact with the beam emitting end portion 13a may be detected in an arbitrary approach direction to the beam emitting end portion. Thus, for example, even though due to unevenness on the surface of the irradiation target, etc., the irradiation target approaches the beam emitting end portion 13a in an arbitrary approach direction within a plane parallel to the X-axis and the Y-axis, the irradiation target is prevented from being in contact with the beam emitting end portion 13a.

The sample chamber 11 and the driving unit 42 is electrically insulated from the displacement member 45 and the irradiation target is electrically connected to the sample chamber 11, and thus based on change in electrical characteristics on conduction of the displacement member 45 and the irradiation target, whether the displacement member 45 is in contact with the irradiation target is easily detected with accuracy.

The sample chamber 11 and the driving unit 42 is thermally insulated from the displacement member 45, and thus even though the displacement member 45 is cooled by the cooling member 19 to a temperature lower than that of the irradiation target, the driving unit 42 is prevented from being cooled and smooth operation of the driving unit 42 is ensured.

Hereinafter, modifications of the above-described embodiment will be described with reference to the accompanying drawings.

Figure 6:
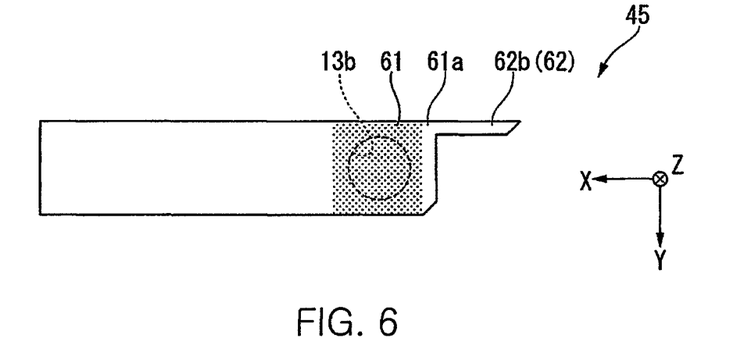
FIG. 6 is a plan view illustrating a displacement member of a charged particle beam apparatus according to a first modification of the embodiment of the present invention viewed from a sample stage, and illustrating a state where an open/close portion placed at an insertion position blocks an opening of a beam emitting end portion.

FIG. 6 is a plan view illustrating a displacement member 45 of a charged particle beam apparatus 10 according to a first modification of the embodiment of the present invention viewed from a sample stage 31, and illustrating a state where an open/close portion 61 placed at an insertion position blocks an opening 13b of a beam emitting end portion 13a.

In the above-described embodiment, the contact portion 62 of the displacement member 45 is provided in the shape of a ring plate, and thus the contact portion 62 is in contact with the irradiation target before the beam emitting end portion 13a in an arbitrary approach direction of the irradiation target to the vicinity of the beam emitting end portion 13a of the electron beam column 13, but the contact portion is not limited thereto. The contact portion 62 may be, for example, provided in the shape where the contact portion 62 is capable of being in contact with the irradiation target in a predetermined approach direction before the beam emitting end portion 13a.

According to the first modification, in the case of tilting the sample stage 31 on the Y-axis, as a rotation direction of the sample plate 12 around the tilt shaft T is set as a predetermined direction (e.g., a clockwise direction in FIG. 2), the contact portion 62 is provided in the form where the contact portion 62 is capable of being in contact with the irradiation target in the predetermined direction before the beam emitting end portion 13a. According to the first modification, the contact portion 62 includes, for example, a protruding part 62b protruding in the X-axis direction from the end portion 61a away from the focused ion beam column 14 in the Y-axis direction of the open/close portion 61. The protruding part 62b is, for example, is placed at a position close to the beam emitting end portion 13a without interfering with the electron beam from the electron beam column 13 irradiating the irradiation target, such as the vicinity after displacement in the Y-axis direction from the position right in front of the beam emitting end 13a in the direction of Z-axis direction, etc.

According to the first modification, with respect to rotation of the sample plate 12 around the tilt shaft T, the contact portion 62 is set to be in contact with the irradiation target before the beam emitting end portion 13a such that the irradiation target is prevented from being in contact with the beam emitting end portion 13a.

Figure 7:
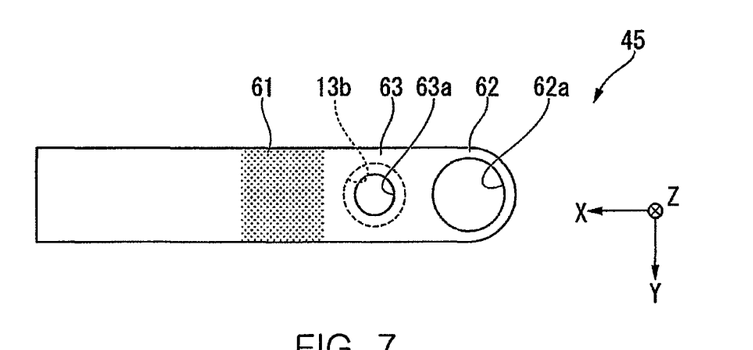
FIG. 7 is a plan view illustrating a displacement member of a charged particle beam apparatus according to a second modification of the embodiment of the present invention viewed from a sample stage, and illustrating a state where an observation part placed at an insertion position partially covers an opening of a beam emitting end portion.

FIG. 7 is a plan view illustrating a displacement member 45 of a charged particle beam apparatus 10 according to a second modification of the embodiment of the present invention viewed from a sample stage 31, and illustrating a state where an observation part 63 placed at an insertion position partially covers an opening 13b of a beam emitting end portion 13a.

In the above-described embodiment, the displacement member 45 includes the open/close portion 61 and the contact portion 62, but is not limited thereto. The displacement member 45 may include an observation part 63 that partially blocks the electron beam from the electron beam column 13 irradiating the irradiation target or the secondary charged particle generated from the irradiation target.

According to the second modification, the displacement member 45 includes, for example, the observation part 63 between the open/close portion 61 and the contact portion 62. The observation part 63 is provided with an observation penetrating hole 63a passing at least a part of the secondary charged particle generated from the irradiation target therethrough. The size of the observation penetrating hole 63a is, for example, smaller than that of the penetrating hole 62a of the contact portion 62 so as not to interfere with the electron beam from the electron beam column 13 irradiating the irradiation target and so as to partially pass the secondary charged particle generated from the irradiation target.

According to the second modification, the displacement member 45 is, for example, provided to displace the open/close portion 61, the contact portion 62, and the observation part 63 between the insertion position and a position distant from the insertion position depending on driving of the displacement member 45 in the X-axis direction by the driving unit 42.

According to the second modification, floating particles, such as sputter particles, gas, etc., are definitely prevented from invading into the electron beam column 13 and adhering thereto.

Figure 8:
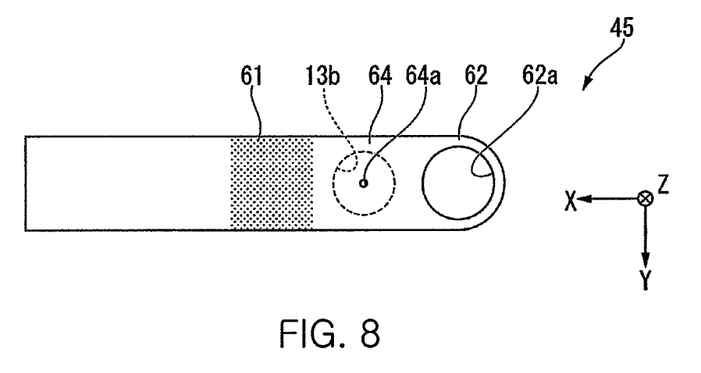
FIG. 8 is a plan view illustrating a displacement member of a charged particle beam apparatus according to a third modification of the embodiment of the present invention viewed from a sample stage, and illustrating a state where an aperture portion placed at an insertion position nearly covers an opening of a beam emitting end portion.

FIG. 8 is a plan view illustrating a displacement member 45 of a charged particle beam apparatus 10 according to a third modification of the embodiment of the present invention viewed from a sample stage 31, and illustrating a state where an aperture portion 64 placed at an insertion position nearly covers an opening of a beam emitting end portion 13a.

In the above-described embodiment, the displacement member 45 includes the open/close portion 61 and the contact portion 62, but is not limited thereto. The displacement member 45 may include an aperture portion 64 for narrowing the electron beam from the electron beam column 13 irradiating the irradiation target. The displacement member 45 having the aperture portion 64 is, for example, used when the electron beam column 13 composes an electron microscope, such as a scanning electron microscope, a transmission electron microscope, etc. and phase recovery processing is executed.

According to the third modification, the displacement member 45 includes, for example, the aperture portion 64 between the open/close portion 61 and the contact portion 62. The aperture portion 64 is provided with a micro aperture penetrating hole 64a passing a part of the electron beam from the electron beam column 13 irradiating the irradiation target. The size of the aperture penetrating hole 64a is, for example, about several μm to several tens μm in diameter, but the opening 13b of the beam emitting end portion 13a is about several mm in diameter.

According to the third modification, the displacement member 45 is, for example, provided to displace the open/close portion 61, the contact portion 62, and the aperture portion 64 between the insertion position and a position distant from the insertion position depending on driving of the displacement member 45 in the X-axis direction by the driving unit 42.

The aperture portion 64 of the displacement member 45 is used as a limited visual field aperture in so-called limited visual field diffraction. In the case where the irradiation target is irradiated by the electron beam from the electron beam column 13 to detect the secondary electron or the transmission electron from the irradiation target, the aperture portion 64 is placed at the insertion position when observing an electron diffraction image, and is placed at a position distant from the insertion position when observing an actual image. When the aperture portion 64 is, for example, placed at the position distant from the insertion position during observation of the actual image, a relative position to the contact portion 62 is set to place the penetrating hole 62a of the contact portion 62 at the insertion position.

The aperture portion 64 placed at the insertion position is a constraint of an actual space image in phase recovery processing, and forms an observation region containing the irradiation target and an outer region of zero potential which is outside of the observation region, whereby convergence of phase recovery processing may be enhanced. During observation of the electron diffraction image, the electron beam widened by a lens and a desired visual field is selected by the aperture portion 64 such that irradiation density of the electron beam is reduced with uniform intensity distribution, and resolution of the electron diffraction image may be increased.

Also, in phase recovery processing, first, Fourier transform is performed on the actual image of the actual space generated randomly to generate an electron diffraction image of an inverse space. Next, the amplitude of the generated electron diffraction image is substituted by the amplitude of an experimentally obtained electron diffraction image (inverse space), and the actual image (actual space) is reconstituted by inverse Fourier transform. In this way, Fourier transform and inverse Fourier transform are repeated such that phase information of the actual image is recovered.

Figure 9A:
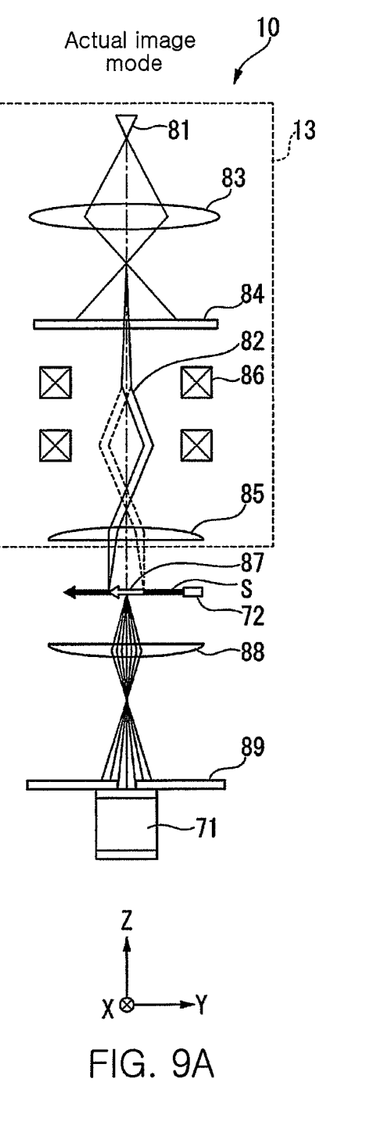
FIG. 9A is a view illustrating paths of electron beams in an actual image mode and FIG. 9B is a view illustrating paths of electron beams in an electron diffraction image mode of a transmission electron microscope having an electron beam column as a charged particle beam apparatus according to the third modification of the embodiment of the present invention.
Figure 9B:
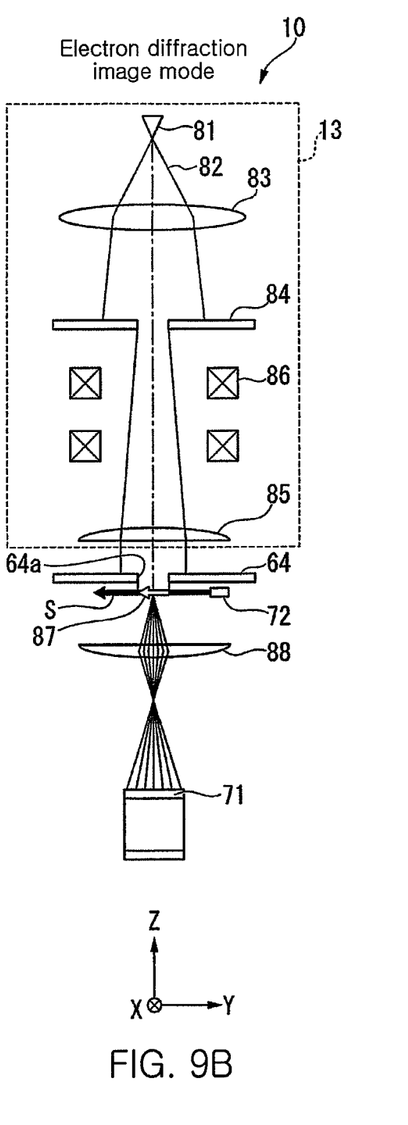

FIG. 9A is a view illustrating paths of electron beams in an actual image mode and FIG. 9B is a view illustrating paths of electron beams in an electron diffraction image mode of a transmission electron microscope having an electron beam column 13 as a charged particle beam apparatus 10 according to the third modification of the embodiment of the present invention.

According to the third modification, the charged particle beam apparatus 10 includes: the electron beam column 13 composing at least a part of an imaging system for obtaining intensity distribution of the actual image and the electron diffraction image; a detector 71 detecting a transmission electron of the irradiation target caused by irradiation with the electron beam; and a sample holder 72 hosing the irradiation target (the sample S, etc.) to enable the detector 71 to detect the transmission electron.

In the actual image mode, electron beams 82 emitted from an electron source 81 converge on an irradiation lens 83, are cut by a condenser aperture 84 only into a portion having a small irradiation angle, and converge on an objective lens 85 into fine electron beams 82 being sub-nm in diameter. The electron beams 82 scan by a scanning coil 86 and irradiate an irradiation region 87 being several tens nm in diameter in the sample S. Transmission electrons scattered and transmitted in the irradiation region 87 are detected over an objective lens 88 by the detector 71. A detection angle limiting aperture 89 placed right in front of the detector 71 sets a detection angle range of the transmission electrons detected by the detector 71.

In the electron diffraction image mode, electron beams 82 emitted from the electron source 81 are widened by the irradiation lens 83 and are cut by the condenser aperture 84 only into a portion having uniform brightness. The electron beams 82 passed through the condenser aperture 84 are parallel to each other by the objective lens 85. Here, scanning by the scanning coil 86 with the electron beams 82 is not performed. At the insertion position immediately above the sample S, the aperture penetrating hole 64a of the aperture portion 64 is placed depending on driving of the displacement member 45 in the X-axis direction by the driving unit 42. The shape of the aperture penetrating hole 64a is provided to be the same as the irradiation region 87 in the actual image mode. The electron beams 82 after being cut by the aperture portion 64 irradiates the irradiate region 87 the same as in the actual image mode.

According to the third modification, the aperture penetrating hole 64a of the aperture portion 64 may enhance convergence of phase recovery processing. During observation of the electron diffraction image, irradiation density of the electron beam may be reduced with uniform intensity distribution, and resolution of the electron diffraction image may be increased.

The embodiments have been disclosed for illustrative purposes, and those skilled in the art will appreciate that various omissions, substitutions, and modifications are possible, without departing from the scope and spirit of the invention as disclosed in the accompanying claims. For example, in the above-described embodiments, the actuator 51 displacing the displacement member 45 in the shift direction parallel to the tilt shaft T prevents that driving of the displacement member 45 interferes with a tilt of the sample plate 12 around the tilt shaft T, but the actuator is not limited thereto. The actuator 51 may displace the displacement member 45 within a range that does not interfere with a tilt of the sample plate 12 around the tilt shaft, even if the shift direction parallel to the tilt shaft T is not used.

What is claimed is:

1. A charged particle beam apparatus comprising:
    a sample stage on which a sample is placed;
    a sample chamber receiving the sample stage therein;
    a charged particle beam column irradiating the sample with a charged particle beam;
    a displacement member including an open/close portion displaceable between an insertion position, which is between a beam emitting end portion of the charged particle beam column and the sample stage so as to block an opening of the beam emitting end portion, and a withdrawal position which is away from the insertion position, and a contact portion provided at a contact position capable of contacting the sample before the beam emitting end portion during operation of the sample stage and configured so as not to interfere with the charged particle beam from the charged particle beam column with which the sample is irradiated;
    driving means for displacing the displacement member; and
    detecting means for detecting whether the sample is in contact with the contact portion.

2. The apparatus of claim 1, wherein the driving means includes an actuator displacing the displacement member at least in a shift direction parallel to a tilt shaft of the sample stage.

3. The apparatus of claim 1, wherein the driving means includes an actuator displacing the displacement member at least in a range that does not interfere with a tilt of the sample stage.

4. The apparatus of claim 1, further comprising:
    an electrical insulation member electrically insulating the displacement member from the sample chamber and the driving means,
    wherein the detecting means includes a power source applying a voltage to the displacement member from outside of the sample chamber and an electrical connection member electrically connecting the sample and the sample chamber and detects whether the sample is in contact with the contact portion based on whether there is conduction between the sample and the contact portion.

5. The apparatus of claim 1, further comprising:
    a thermal insulation member thermally insulating the displacement member from the sample chamber and the driving means, and
    cooling means for cooling the displacement member to a temperature lower than that of the sample.

6. The apparatus of claim 5, wherein the cooling means includes a cooling member placed in a vicinity of the sample, and a thermal connection member thermally connecting the cooling member and the displacement member.

7. The apparatus of claim 1, further comprising:
an imaging system obtaining intensity distribution of an actual image and a diffraction image by detecting transmitted charged particles or scattered charged particles of the sample,
wherein the displacement member includes an aperture portion displaceable between the insertion position and the withdrawal position and an aperture penetrating hole passing the charged particle beam at the insertion position is formed on the aperture portion.

8. The apparatus of claim 1, wherein the charged particle beam column includes an electron beam column irradiating the sample with an electron beam, and a focused ion beam column irradiating the sample with a focused ion beam.

* * * * *